(12) United States Patent
Moon et al.

(10) Patent No.: US 8,879,012 B2
(45) Date of Patent: Nov. 4, 2014

(54) ARRAY SUBSTRATE HAVING A SHIELDING PATTERN, AND A LIQUID CRYSTAL DISPLAY DEVICE HAVING THE SAME

(75) Inventors: Kyo Ho Moon, Dalseo-gu (KR); Chul Gu Lee, Goyang-si (KR); Seong Woo Jeong, Paju-si (KR); Jeong Yeon Kim, Paju-si (KR); Ji Suk Kim, Gumi-si (KR); Hoon Choi, Incheon (KR); Sang Moo Park, Goyang-si (KR); Sang Kug Han, Gwangju (KR)

(73) Assignee: LG Display Co., Ltd., Seoul (KR)

( * ) Notice: Subject to any disclaimer, the term of this patent is extended or adjusted under 35 U.S.C. 154(b) by 407 days.

(21) Appl. No.: 12/561,553

(22) Filed: Sep. 17, 2009

(65) Prior Publication Data

US 2010/0091212 A1 Apr. 15, 2010

(30) Foreign Application Priority Data

Oct. 10, 2008 (KR) .................. 10-2008-0099401

(51) Int. Cl.
| | | |
|---|---|---|
| *G02F 1/136* | (2006.01) | |
| *G02F 1/1333* | (2006.01) | |
| *G02F 1/1343* | (2006.01) | |
| *H01L 29/786* | (2006.01) | |
| *G02F 1/1335* | (2006.01) | |

(52) U.S. Cl.
CPC ...... *H01L 29/7869* (2013.01); *G02F 1/133509* (2013.01); *H01L 29/78633* (2013.01)
USPC .................. 349/44; 349/43; 349/47; 349/111; 349/139

(58) Field of Classification Search
CPC .................................................. G02F 1/136209
USPC .......................... 349/44, 47, 43, 46, 111, 139
See application file for complete search history.

(56) References Cited

U.S. PATENT DOCUMENTS

| | | | | |
|---|---|---|---|---|
| 4,938,567 | A * | 7/1990 | Chartier | 359/245 |
| 5,032,883 | A * | 7/1991 | Wakai et al. | 257/59 |
| 5,814,836 | A | 9/1998 | Hyun | |
| 6,172,728 | B1 * | 1/2001 | Hiraishi | 349/139 |
| 6,697,138 | B2 * | 2/2004 | Ha et al. | 349/114 |
| 6,947,108 | B2 * | 9/2005 | Chae | 349/113 |
| 7,164,230 | B2 * | 1/2007 | Park | 313/505 |
| 2003/0020852 | A1 * | 1/2003 | Chang et al. | 349/110 |
| 2003/0193623 | A1 | 10/2003 | Lim | |
| 2007/0207574 | A1 * | 9/2007 | Wang et al. | 438/149 |
| 2007/0291204 | A1 * | 12/2007 | Otake | 349/114 |

FOREIGN PATENT DOCUMENTS

| | | | | |
|---|---|---|---|---|
| CN | 101089710 A | 12/2007 | | |
| JP | 8-338998 A | 12/1996 | | |
| JP | 08338998 A | * 12/1996 | ............. | G02F 1/136 |
| JP | 10-41521 A | 2/1998 | | |

(Continued)

*Primary Examiner* — Bumsuk Won
*Assistant Examiner* — Paisley L Arendt
(74) *Attorney, Agent, or Firm* — Birch, Stewart, Kolasch & Birch, LLP

(57) ABSTRACT

An array substrate for a liquid crystal display device and a fabrication method thereof, and a liquid crystal display device having the same are disclosed. The array substrate for a liquid crystal display device and a fabrication method thereof, and a liquid crystal display device having the same according to the present disclosure eliminate optical loss by use of a shielding film that can decrease the optic leakage current to minimize the optic leakage loss, thus it is possible to improve the picture quality.

3 Claims, 4 Drawing Sheets

(56) References Cited

FOREIGN PATENT DOCUMENTS

| | | |
|---|---|---|
| JP | 10-221704 A | 8/1998 |
| JP | 2003-107455 A | 4/2003 |
| JP | 2003-337349 A | 11/2003 |
| JP | 2004-144965 A | 5/2004 |
| KR | 10-2003-0010022 A | 2/2003 |

* cited by examiner

ARRAY SUBSTRATE HAVING A SHIELDING PATTERN, AND A LIQUID CRYSTAL DISPLAY DEVICE HAVING THE SAME

CROSS-REFERENCE TO RELATED APPLICATION

This application claims priority under 35 U.S.C. 119 to Korean Patent Application No. 10-2008-0099401, filed on Oct. 10, 2008, which is hereby incorporated by reference in its entirety.

BACKGROUND

1. Field of the Disclosure

This disclosure relates to a liquid crystal display device, and more particularly to an array substrate for a liquid crystal display device and a manufacturing method thereof, which is adaptive for improve the picture quality by minimizing photo leakage current, and a liquid crystal display device having the same.

2. Description of the Related Art

In general, a liquid crystal display device controls the light transmittance of liquid crystal by use of electric field, thereby displaying a picture. To this end, the liquid crystal display device includes a liquid crystal display panel where pixel areas are arranged in a matrix shape, a drive circuit for driving the liquid crystal display panel, and a backlight unit for supplying a designated amount of light to the liquid crystal display panel.

In the liquid crystal display panel, a plurality of gate lines and a plurality of date lines are arranged to cross, and a pixel area is located in an area which is defined by the perpendicular intersection of the gate lines and the date lines. A common electrode and pixel electrodes for applying electric field to each of the pixel areas are formed in the liquid crystal display panel. Each of the pixel electrodes is connected to the data line through a source terminal and a drain terminal of a thin film transistor that is a switching device. The thin film transistor is turned on by a scan pulse applied to the gate line to make a data signal of the data line charged in the pixel electrode.

The liquid crystal display panel includes two substrates (upper and lower substrates) and a liquid crystal layer formed between the two substrates. A color filter and a black matrix are formed in the upper substrate of the two substrates, and a thin film transistor (TFT) is formed in the lower substrate to correspond to the black matrix.

The light exited from the light source of the backlight unit is reflected by the liquid crystal cells forming a liquid crystal layer, the black matrix and the color filter of the upper substrate of the liquid crystal display panel, thereby affecting a channel layer of the thin film transistors. Hereby, a pixel voltage charged in the pixel electrode is affected to generate a difference between the pixel electrode charged in the pixel electrode and the actual data signal supplied to the data line, thereby generating a picture quality deterioration problem, e.g., a picture which is not wanted is displayed.

The channel layer of the thin film transistor is affected by light, thus a leakage current is generated in the channel layer if the light reflected by the liquid crystal cell, the black matrix and the color filter of the upper substrate enters into the channel layer of the thin film transistor. Because of this, the pixel voltage charged in the pixel electrode is affected, thereby generating a picture quality deterioration, e.g., patterns which are not wanted are generated.

BRIEF SUMMARY

Accordingly, the present embodiments are directed to a liquid crystal display device that substantially obviates one or more of problems due to the limitations and disadvantages of the related art.

An object of the embodiment of the present disclosure is to provide an array substrate for a liquid crystal display device and a manufacturing method thereof, which is adaptive for minimizing a picture quality deterioration caused by a leakage current of a channel layer of a thin film transistor by way of forming a shielding film on a passivation layer, which corresponds to the channel layer of the thin film transistor, in order to intercept the light reflected by the liquid crystal cell, a black matrix and a color filter, and a liquid crystal display device having the same.

Another object of the embodiment of the present disclosure is to provide an array substrate for a liquid crystal display device and a manufacturing method thereof, which is adaptive for improving picture quality, and a liquid crystal display device having the same.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

In one general aspect of the present embodiment, an array substrate for a liquid crystal display device includes a substrate; a gate electrode formed on the substrate; a gate insulating film formed on the substrate where the gate electrode is formed; a semiconductor layer formed on the substrate where the gate insulating film is formed so as to correspond to the gate electrode; source and drain electrodes which are separated from each other on the substrate where the semiconductor layer is formed; a passivation layer formed in the entire surface of the substrate where the source and drain electrodes are formed; a shielding film located on the passivation layer to correspond to the gate electrode; and a pixel electrode which is formed on the passivation layer to be separated from the shielding film and is electrically connected to the drain electrode through the contact hole.

In another aspect of the present embodiment, a fabricating method of an array substrate for a liquid crystal display device includes a step of preparing a substrate: a first mask process step of forming a gate electrode on the substrate; a step of forming a gate insulating film on the substrate where the gate electrode is formed; a second mask process step of forming, on the substrate where the gate insulating film is formed, an active layer to correspond to the gate electrode, source and drain electrodes on the active layer to be separated from each other, and an ohmic contact layer between the source and drain electrodes and the active layer; a step of forming a passivation layer on the substrate where the source and drain electrodes and the ohmic contact layer is formed; a third mask process step of forming a contact hole on the passivation layer to make a part of the drain electrode exposed; and a fourth mask process step of forming a pixel electrode that is connected to the drain electrode through the contact hole on the passivation layer, and a shielding film which is formed at the same time as the pixel electrode and is located to correspond to the gate electrode.

In another aspect of the present embodiment, a liquid crystal display device includes a liquid crystal display panel; and a light source that illuminates light to the liquid crystal display panel, and wherein the liquid crystal display panel includes a first substrate having a thin film transistor that includes a gate electrode, a gate insulating film formed on the gate electrode, a semiconductor layer formed on the gate insulating film to correspond to the gate electrode, source and drain electrodes separated from each other on the semiconductor layer, a passivation layer formed on the source and drain electrodes, a pixel electrode electrically connected through a contact hole to the drain electrode on the passivation layer, and a shielding film that is formed at the same time as the pixel electrode and is located to correspond to the gate electrode on the passivation layer; a second substrate that faces the first substrate and includes a color filter and a black matrix; and an active layer formed on the first and second substrates, and wherein the shielding film intercepts the light exiting from the light source so that the light is prevented from entering into a channel part of the semiconductor layer by being reflected in the liquid crystal layer and the black matrix and the color filter of the second substrate.

Other systems, methods, features and advantages will be, or will become, apparent to one with skill in the art upon examination of the following figures and detailed description. It is intended that all such additional systems, methods, features and advantages be included within this description, be within the scope of the disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the disclosure and together with the description serve to explain the disclosure. In the drawings.

DETAILED DESCRIPTION

Figure 1:
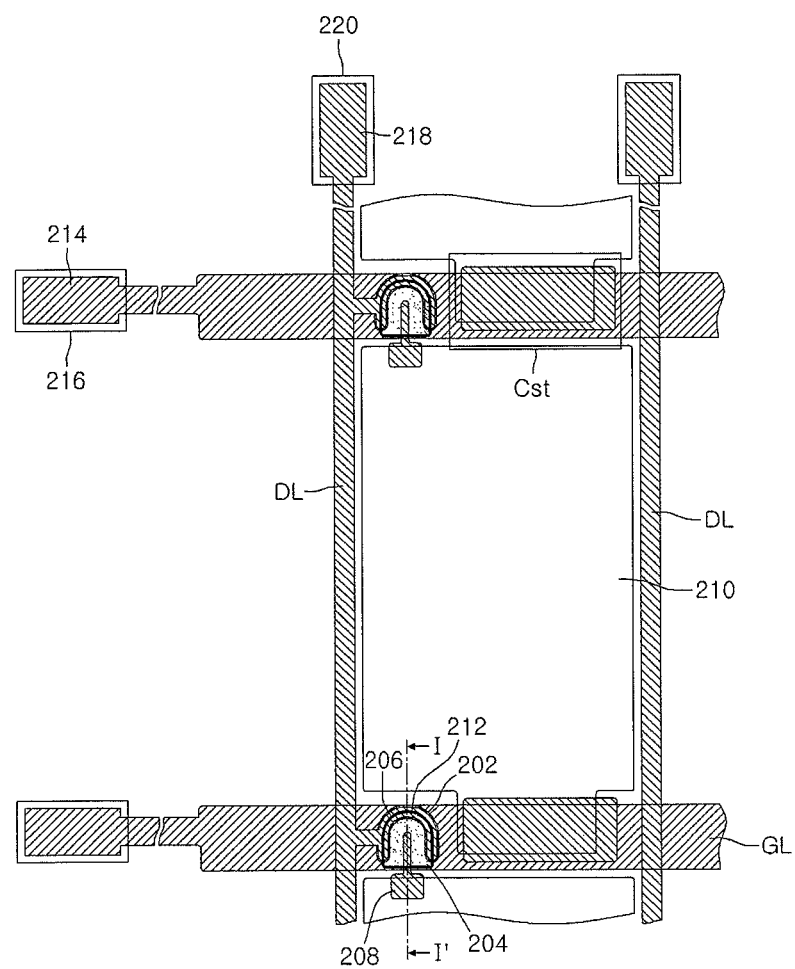
FIG. 1 is a diagram illustrating part of an array substrate for a liquid crystal display device according to an embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

FIG. 1 is a diagram illustrating part of an array substrate for a liquid crystal display device according to an embodiment of the present disclosure.

As shown in FIG. 1, an array substrate for a liquid crystal display device according to an embodiment of the present disclosure includes a gate line GL which has a gate pad 214 at an end and a data line DL which crosses the gate line GL to define a pixel area P and which has a data pad 218 at one end, on a glass substrate 201.

A gate pad electrode 216 and a data pad electrode 220 are each located at and in contact with the upper parts of the gate pad 214 and the data pad 218.

A thin film transistor TFT including a gate electrode 202, a semiconductor layer 204 inclusive of an ohmic contact layer, a source electrode 206, a drain electrode 208 and a shielding pattern 212 is formed at an intersection area of the gate line GL and the data line DL.

A pixel electrode 210 electrically connected to the drain electrode 208 of the thin film transistor TFT is formed in the pixel area P.

The gate electrode 202 of the thin film transistor TFT is formed at the same time as the gate line GL and electrically connected to the gate line GL. The source electrode 206 is formed at the same time as the data line DL and electrically connected to the data line DL.

The thin film transistor (TFT), as shown in FIG. 1, might be composed in a various shape such as "U" shape or island shape.

A shielding pattern 212 of the thin film transistor TFT is formed at the same time as the pixel electrode 210, and might be formed of the same material as the pixel electrode 210. When light is illuminated from the backlight to the liquid crystal display panel inclusive of the array substrate for the liquid crystal display device, the shielding pattern 212 plays a role of shielding the light that is reflected from a liquid crystal cell, a color filter and a black matrix formed at a color filter substrate facing the array substrate for the liquid crystal display device and that is applied to the thin film transistor TFT.

Figure 2:
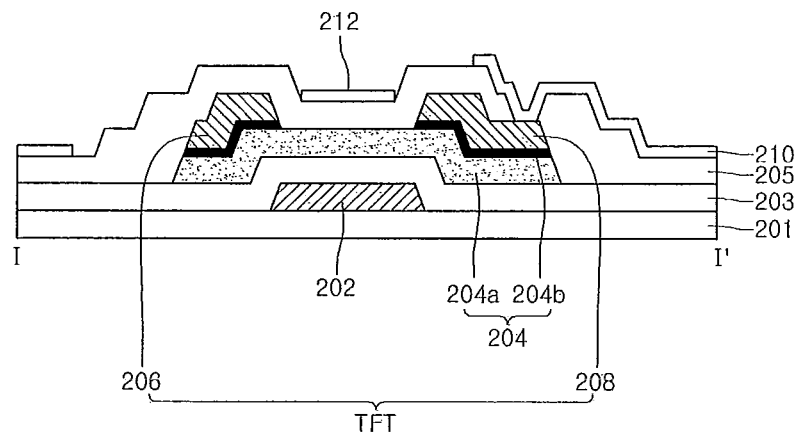
FIG. 2 is a sectional view of thin film transistors (TFT) of FIG. 1, taken along the line I-I'.

FIG. 2 is a sectional view of thin film transistors TFT of FIG. 1, taken along the line I-I'.

As shown in FIG. 2, the thin film transistor TFT includes a gate electrode 202 extended from the gate line GL, a gate insulating film 203 formed on a substrate 201 where the gate electrode 202 is formed, a semiconductor layer 204 formed on the gate insulating film 203 to correspond to the gate electrode 202, source and drain electrodes 206, 208 formed to be separated from each other on the semiconductor layer 204, a passivation layer 205 formed on the substrate 201 where the source and drain electrodes 206, 208 are formed, and a shielding pattern 212 formed on the passivation layer 205 to correspond to the gate electrode 202.

On the other hand, the drain electrode 208 is electrically connected to the pixel electrode 210 through a contact hole on the passivation layer 205.

The semiconductor layer 204 includes an active layer 204a and an ohmic contact layer 204b.

The shielding pattern 212 is formed on the passivation layer 205 to correspond to the gate electrode 202 and might be formed of indium-tin-oxide (ITO) or indium-zinc-oxide (IZO) which is the same material as the pixel electrode 210. The shielding pattern 212 might be formed of any one of molybdenum titanium alloy (MoTi), copper (Cu), molybdenum alloy (MoNb), molybdenum Mo, chromium (Cr), and Aluminum (AlNd).

When light is illuminated from the backlight to the liquid crystal display panel including the array substrate for the liquid crystal display device having the thin film transistor TFT, the shielding pattern 212 plays a role of shielding the light that is reflected to the thin film transistor TFT by the liquid crystal cells, the color filter and the black matrix formed in the color filter array substrate which faces the array substrate for the liquid crystal display device.

If the light illuminated from the backlight is reflected by the liquid crystal tells, the color filer and the black matrix of the color filter array substrate to enter into the channel layer of the semiconductor layer 204 of the thin film transistor TFT, a leakage current flows in the channel layer of the thin film transistor TFT. Accordingly, the shielding pattern 212 is formed on the passivation layer 205, thus the light reflected by the liquid crystal cells, the color filter and the black matrix of the color filter array substrate is prevented from flowing into the channel layer of the thin film transistor TFT, thereby minimizing the leakage current.

The shielding pattern 212 might be formed in various shapes in which the light is prevented from entering into the channel layer of the thin film transistor TFT by a structure formed in the color filter array substrate.

FIGS. 3 to 8 are diagrams sequentially illustrating a fabrication process of the thin film transistor of FIG. 1.

Figure 3:
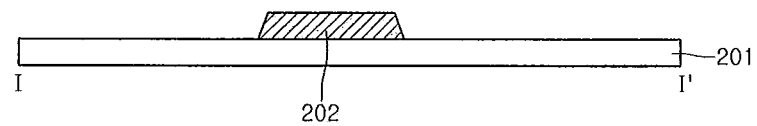
FIGS. 3 to 8 are diagrams sequentially illustrating a fabrication process of the thin film transistor of FIG. 1.

As shown in FIG. 3, a first mask process of the thin film transistor TFT according to an embodiment of the present disclosure selects and deposits any one of a conductive metal group inclusive of aluminum Al, aluminum alloy AlNd, Tungsten W, Chromium Cr, molybdenum Mo, and etc on the substrate 201, and patterns it to form the gate electrode 202.

Figure 4:
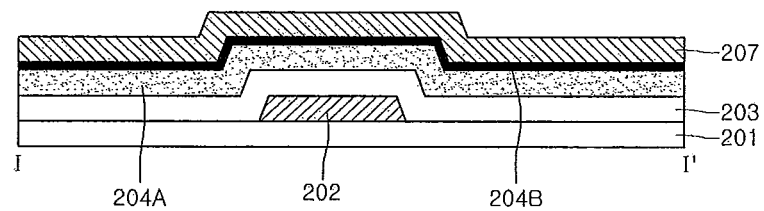

A gate insulating film 203 is formed, as shown in FIG. 4, in the entire surface of the substrate 201 where the gate electrode 202 is formed. The gate insulating film 203 is formed by selecting any one of an inorganic insulating group inclusive of silicon nitride SiNx, silicon oxide a-Si:H and etc and depositing it on the substrate 201. As circumstances require, the gate insulating film 203 might be formed by depositing any one of organic insulating material inclusive of benzocyclobutane BCB, acrylic resin and etc.

An amorphous silicon a-Si:H, 204A is deposited to be formed on the substrate 201 where the gate insulating film 203, and a doped amorphous silicon n+a-Si:H, 204B is deposited to be formed on the amorphous silicon 204A. A conductive metal film 207 is deposited to be formed on the substrate 201 where the amorphous silicon 204A and the doped amorphous silicon 204B are formed.

The conductive metal film 207 might be formed of any one of a conductive metal group inclusive of aluminum Al, aluminum alloy AlNd, tungsten W, chromium Cr, molybdenum Mo, and etc.

Figure 5:
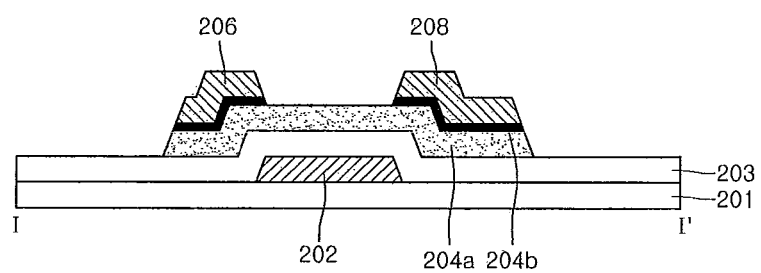

The amorphous silicon 204A, the doped amorphous silicon 204B and the conductive metal film 207 are patterned through a second mask process, as shown in FIG. 5.

Specifically, a photosensitive film (not shown) is formed on the substrate 201 where the amorphous silicon 204A, the doped amorphous silicion 204B and the metal pattern 207. If a mask (not shown) inclusive of a transmitting part, a semi-transmitting part and a shielding part is located on the substrate 201 where the photosensitive film is formed, light is illuminated to the upper part of the mask, the photosensitive film of the lower part is exposed and developed, then the photosensitive film is patterned on the substrate 201 in accordance with the area where the transmitting part, the semi-transmitting part and the shielding part of the mask are located.

The substrate 201 where the patterned photosensitive film is formed goes through an ashing process and etching process sequentially. Through such processes, the conductive metal film 207 is formed to be the source and drain electrodes 206, 208 which are separated from each other, the doped amorphous silicon 204B is formed to be the ohmic contact layer 204B which is separated by the distance which separates the source and drain electrodes 206, 208. The part of the amorphous silicon 204B is exposed to the outside to be an active layer 204a.

Figure 6:
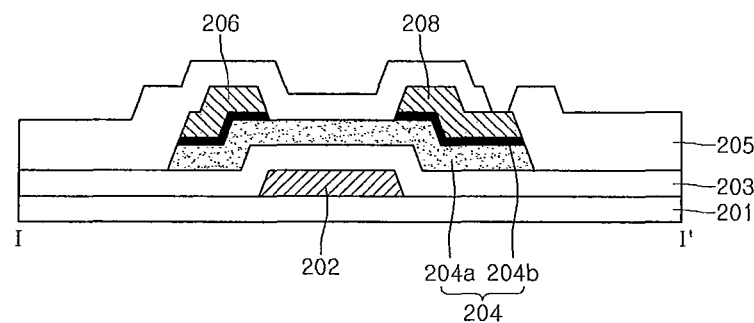

A passivation layer 205 is, as shown in FIG. 6, formed on the substrate 201 where the source and drain electrodes 206, 208 are formed. The passivation layer 205 plays a role of protecting the source and drain electrodes 206, 208, the active layer 204a and the ohmic contact layer 204b from the impurities which come from the outside. A contact hole is formed through a third mask process that the part of the drain electrode 208 is exposed on the substrate 201 where the passivation layer 205 is formed.

The contact hole is formed on the passivation layer 205 to make the part of the drain electrode 208 exposed to the outside.

Figure 7:
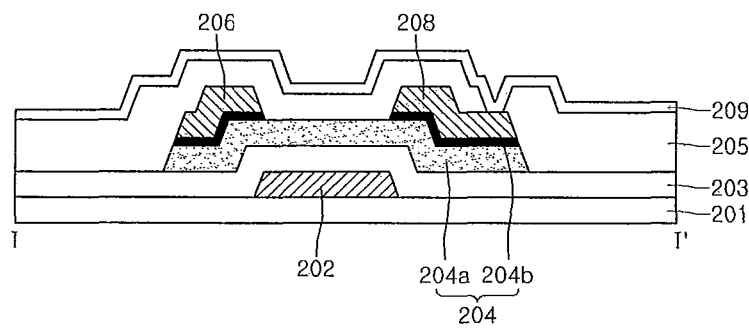

A transparent metal film 209 is, as shown in FIG. 7, formed on the substrate 201 where the passivation layer 205 inclusive of the contact hole is formed. The transparent metal film 209 is formed in the entire surface of the substrate 201 to be connected to the drain electrode 208 of which is partly exposed. The transparent metal film 209 is formed of any one selected among the transparent conductive metal group inclusive of indium-tin-oxide (ITO) and indium-zinc-oxide (IZO).

Figure 8:
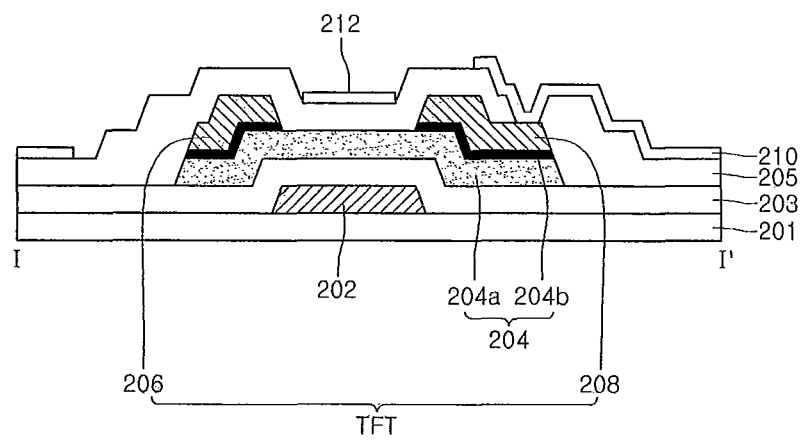

The transparent metal film 209 formed in the entire surface of the substrate 201 is, as shown in FIG. 8, patterned through a fourth mask process.

Specifically, a photosensitive film (not shown) is formed on the upper part of the substrate 201 where the transparent metal film 209 is formed, and a mask (not shown) inclusive of a transmitting part and a shielding part is located at the upper part of the photosensitive film. Then, if light is illuminated to the upper part of the mask to expose and to develop the photosensitive film of the lower part, the photosensitive film is patterned in accordance with the area where the transmitting part and the shielding part of the mask are located.

The patterned photosensitive film is respectively formed at a part where the drain electrode 208 is located and at a part where the gate electrode 202 is located. If the patterned photosensitive film is removed after eliminating the transparent metal film 209 which is exposed between the patterned photosensitive film, a shielding pattern 212 is formed at a location which corresponds to the gate electrode 202 and the pixel electrode 210 connected to the drain electrode 908 on the substrate 201 where the passivation film 205 is formed.

The shielding pattern 212, as described above, might be formed of indium-tin-oxide (ITO) or indium-zinc-oxide (IZO) which is the same material as the pixel electrode 210. Further, the shielding pattern 212 might be formed of any one of molytitanium MoTi, copper Cu, molybdenum alloy MoNb, molybdenum Mo, chromium Cr, and aluminum alloy AlNd.

When light is illuminated from the backlight to the liquid crystal display panel inclusive of the array substrate for the liquid crystal display device having the thin film transistor TFT inclusive of the shielding pattern 212, the shielding pattern 212 plays a role of shielding the light that is reflected to the thin film transistor TFT by the liquid crystal cells, the color filter and the black matrix that are formed in the color filter array substrate facing the array substrate for the liquid crystal display device.

If the light illuminated from the backlight is reflected by the liquid crystal cells, the color filter and the black matrix of the color filter array substrate and enters into the channel layer of the semiconductor layer 204 of the thin film transistor TFT, a leakage current flows in the channel layer of the thin film transistor TFT. Accordingly, the shielding pattern 212 is formed on the passivation layer 205, thus the light reflected by the liquid crystal cells, the color filter and the black matrix of the color filter array substrate is prevented from entering into the channel layer of the thin film transistor TFT, thereby minimizing the leakage current.

As the leakage current of the thin film transistor TFT is minimized, the pixel voltage charged in the pixel electrode connected to the thin film transistor TFT is not affected, thereby improving the picture quality.

Figure 9:
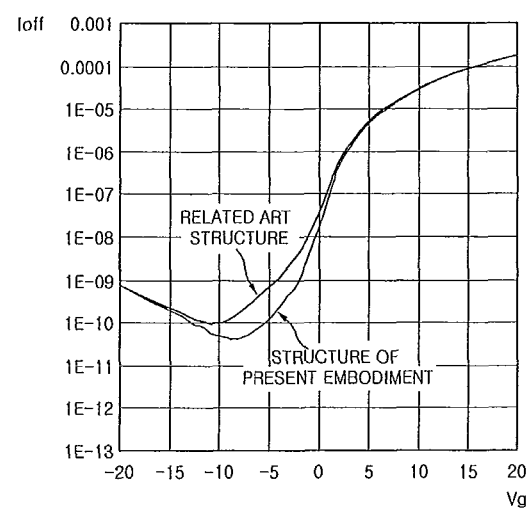
FIG. 9 is a graph comparing the leakage current of a related art thin film transistor with that of the thin film transistor according to the present disclosure.

FIG. 9 is a graph comparing the leakage current of a related art thin film transistor with that of the thin film transistor according to the present disclosure.

As shown in FIG. 9, the horizontal axis of the graph is a gate voltage Vg applied to the gate terminal of the thin film transistor, and the vertical axis of the graph is a leakage current Ioff of the thin film transistor.

When the gate voltage Vg is applied at −5V, the leakage current of the related art thin film transistor is 692 pA and the leakage current of the thin film transistor according to the present disclosure inclusive of the shielding pattern 212 is 166 pA. Accordingly, the leakage current of the thin film transistor according to the present disclosure inclusive of the shielding pattern 212 is observed to decrease by 70% when compared with the leakage current of the related art thin film transistor. The graph shown in FIG. 9 is an experimental data, but it is shown that the leakage current of the thin film transistor according to the present disclosure inclusive of the shielding pattern 212 decreases more than the leakage current of the related art thin film transistor.

Accordingly, as in the present disclosure, the shielding pattern is included in the passivation layer, thus it is possible to minimize the leakage current by preventing the light illuminated from the backlight from entering into the channel layer of the thin film transistor by the color filter array substrate. As the leakage current of the thin film transistor is minimized, the pixel voltage charged in the pixel electrode connected to the thin film transistor TFT is not affected, thus it is possible to improve the picture quality by displaying the desired picture.

As describe above, the present disclosure forms the shielding film on the passivation layer to correspond to the channel layer of the thin film transistor to intercept the light reflected by the liquid crystal cell, the black matrix and the color filter formed in the upper substrate and to minimize the leakage current of the channel layer, thereby improving the picture quality.

Although the present disclosure has been explained by the embodiments described above, it should be understood to the ordinary skilled person in the art that the disclosure is not limited to the embodiments but rather that various changes or modifications thereof are possible without departing from the spirit of the disclosure. Accordingly, the scope of the disclosure shall be determined only by the appended claims and their equivalents.

What is claimed is:

1. A liquid crystal display device comprising:
a liquid crystal display panel; and
a light source that emits light onto the liquid crystal display panel, wherein the liquid crystal display panel comprises:
a first substrate having a thin film transistor that includes a gate electrode, a gate insulating film formed on the gate electrode, a semiconductor layer formed on the gate insulating film to correspond to the gate electrode, source and drain electrodes separated from each other on the semiconductor layer, a passivation layer formed on the source and drain electrodes, a pixel electrode electrically connected through a contact hole to the drain electrode on the passivation layer, and a shielding film that is formed at the same time as the pixel electrode and is located to correspond to the gate electrode on the passivation layer;
a second substrate that faces the first substrate and includes a color filter and a black matrix; and
a liquid crystal layer formed between the first substrate and second substrate,
wherein the shielding film intercepts the light exiting from the light source so that the light is prevented from entering into a channel part of the semiconductor layer by being reflected in the liquid crystal layer and the black matrix and the color filter of the second substrate,
wherein the shielding film and the source and drain electrodes are only formed on the semiconductor layer,
wherein the shielding film is disposed on a side of the pixel electrode which includes a portion that is higher than the shielding film in a direction normal to the first substrate, and
wherein the shielding film is formed from the same material as the pixel electrode, and configured to minimize a leakage current of the first substrate to minimize changes due to the leakage current in a pixel voltage charged in the pixel electrode which includes the portion that is higher than the shielding film.

2. The liquid crystal display device according to claim 1, wherein the shielding film does not overlap the source electrode and drain electrode.

3. The liquid crystal display device according to claim 1, wherein the thin film transistor comprises the gate electrode, the semiconductor layer, and the source and drain electrodes and is composed in a "U" shape.

* * * * *